(12) United States Patent
Murden et al.

(10) Patent No.: US 7,525,381 B2
(45) Date of Patent: Apr. 28, 2009

(54) AMPLIFIER STRUCTURES THAT ENHANCE TRANSIENT CURRENTS AND SIGNAL SWING

(75) Inventors: Franklin M. Murden, Roan Mountain, TN (US); Ege Yetis, San Diego, CA (US)

(73) Assignee: Analog Devices, Inc., Norwood, MA (US)

( * ) Notice: Subject to any disclaimer, the term of this patent is extended or adjusted under 35 U.S.C. 154(b) by 151 days.

(21) Appl. No.: 11/716,169

(22) Filed: Mar. 9, 2007

(65) Prior Publication Data

US 2008/0218265 A1    Sep. 11, 2008

(51) Int. Cl.
*H03F 3/45* (2006.01)
*H03F 1/52* (2006.01)

(52) U.S. Cl. ........................... 330/261; 330/253
(58) Field of Classification Search ............. None
See application file for complete search history.

(56) References Cited

U.S. PATENT DOCUMENTS

| | | | | |
|---|---|---|---|---|
| 4,794,349 A * | 12/1988 | Senderowicz et al. | ...... | 330/253 |
| 5,023,567 A * | 6/1991 | O'Shaughnessy et al. | ... | 330/253 |
| 5,281,924 A * | 1/1994 | Maloberti et al. | .......... | 330/253 |
| 5,376,899 A | 12/1994 | Pass | ............. | 330/253 |
| 5,442,318 A * | 8/1995 | Badyal et al. | .............. | 330/253 |
| 5,578,965 A * | 11/1996 | Kimura | .............. | 330/254 |
| 5,604,464 A * | 2/1997 | Hwang et al. | .............. | 330/253 |
| 5,760,647 A * | 6/1998 | Miller et al. | .............. | 330/252 |
| 5,789,981 A * | 8/1998 | Singer et al. | .............. | 330/253 |
| 6,127,958 A * | 10/2000 | Chang et al. | .............. | 341/155 |
| 6,166,584 A | 12/2000 | De | ............. | 327/534 |
| 6,295,012 B1 * | 9/2001 | Greig | .............. | 341/136 |
| 6,377,085 B1 * | 4/2002 | Giuroiu | .............. | 327/66 |
| 6,489,904 B1 * | 12/2002 | Hisano | .............. | 341/120 |
| 6,529,070 B1 * | 3/2003 | Nagaraj | .............. | 330/9 |
| 6,603,354 B1 * | 8/2003 | Opris | .............. | 330/253 |
| 6,630,847 B2 | 10/2003 | Hunt | ............. | 327/65 |
| 6,642,788 B1 * | 11/2003 | Abughazaleh | ............. | 330/253 |
| 6,650,263 B1 * | 11/2003 | Dillon | .............. | 341/122 |
| 6,747,514 B1 | 6/2004 | Aude | .............. | 330/253 |
| 6,756,929 B1 * | 6/2004 | Ali | .............. | 341/161 |
| 6,778,013 B1 * | 8/2004 | Ali | .............. | 330/252 |
| 6,778,014 B2 | 8/2004 | Rennig | .............. | 330/253 |
| 6,778,126 B2 * | 8/2004 | Ali | | |
| 6,781,460 B2 * | 8/2004 | Crain et al. | .............. | 330/253 |
| 6,784,500 B2 | 8/2004 | Lemkin | .............. | 257/368 |

(Continued)

OTHER PUBLICATIONS

Yan, Shouli, "Low Voltage Analog Circuit Design Techniques: A Tutorial", IEEE Trans. Analog Integrated Circuits and Systems, vol. E00-A, 17 pages, No. 2, Feb. 2000.

*Primary Examiner*—Robert Pascal
*Assistant Examiner*—Krista M Flanagan
(74) *Attorney, Agent, or Firm*—Koppel, Patrick, Heybl & Dawson

(57) ABSTRACT

Amplifier embodiments are provided that are well suited for systems which require high signal gains and high transient currents that can drive various loads (e.g., capacitive loads). At least one amplifier embodiment is realized with a cascoded complementary differential input stage, a complementary differential output stage, and a bias controller. The output stage includes lower and upper differential pairs of transistors that respectively have lower and upper coupled back gates and the bias controller is configured to provide bias voltages for the lower and upper coupled back gates.

26 Claims, 5 Drawing Sheets

U.S. PATENT DOCUMENTS

| | | | |
|---|---|---|---|
| 6,839,009 B1 * | 1/2005 | Ali | 341/118 |
| 6,933,784 B2 | 8/2005 | Alenin | 330/264 |
| 6,970,124 B1 * | 11/2005 | Patterson | 341/155 |
| 6,987,471 B1 * | 1/2006 | Murden et al. | 341/118 |
| 7,078,971 B2 * | 7/2006 | Colbeck | 330/255 |
| 7,119,584 B1 * | 10/2006 | Ali | 327/91 |
| 7,138,865 B1 * | 11/2006 | Murden et al. | 330/252 |
| 7,173,470 B2 * | 2/2007 | Murden et al. | 327/291 |
| 7,176,760 B2 * | 2/2007 | Jones | 330/253 |
| 7,221,191 B2 * | 5/2007 | Ali et al. | 327/94 |
| 7,253,686 B2 * | 8/2007 | Ali | 330/259 |
| 2008/0106335 A1 * | 5/2008 | Kimura | 330/253 |

* cited by examiner

AMPLIFIER STRUCTURES THAT ENHANCE TRANSIENT CURRENTS AND SIGNAL SWING

BACKGROUND OF THE INVENTION

1. Field of the Invention

The present invention relates generally to signal amplifiers and applications thereof.

2. Description of the Related Art

The accuracy of many electronic systems is degraded if critical amplifiers cannot supply transient currents that are sufficient to accurately amplify input signals. For example, signal amplifiers are often required to drive loads which partially or wholly comprise a capacitive load. To generate an accurate amplified version of an input signal across these capacitive loads, the amplifier must provide high transient currents which can accurately alter the output signal's amplitude. Limitations in these transient currents leads directly to degraded performance.

An exemplary amplifier is an amplifier in a multiplying digital-to-analog converter (MDAC) of a pipelined analog-to-digital converter system. Such systems are configured with successive converter stages which each convert an analog input signal to respective digital bits of a final digital code that corresponds to the analog input signal. Except for a final converter stage, each converter stage also passes a residue signal to a succeeding stage for further conversion processing.

The residue signal is the difference between the analog signal presented to the stage and the analog equivalent of this stage's respective digital bits. Errors in generation of the residue signal cannot be corrected and, accordingly, they contribute directly to errors in the corresponding digital code.

Integrated circuit MDACs are often configured with capacitors that are switched in a first portion of each sample period to receive a charge from the residue signal of the preceding converter stage and switched in a second portion of each sample period to transfer this charge to an output capacitor. These charging and transferring processes are generally accomplished with the aid of an MDAC amplifier and the accuracy of these processes is dependent upon the ability of this amplifier to provide high-level transient currents to the MDAC capacitors. This is but one example of a need for amplifiers having enhanced transient performance.

BRIEF SUMMARY OF THE INVENTION

The present invention is generally directed to structures of differential amplifiers that enhance transient currents and signal swing. The drawings and the following description provide an enabling disclosure and the appended claims particularly point out and distinctly claim disclosed subject matter and equivalents thereof.

DETAILED DESCRIPTION OF THE INVENTION

Figure 1:
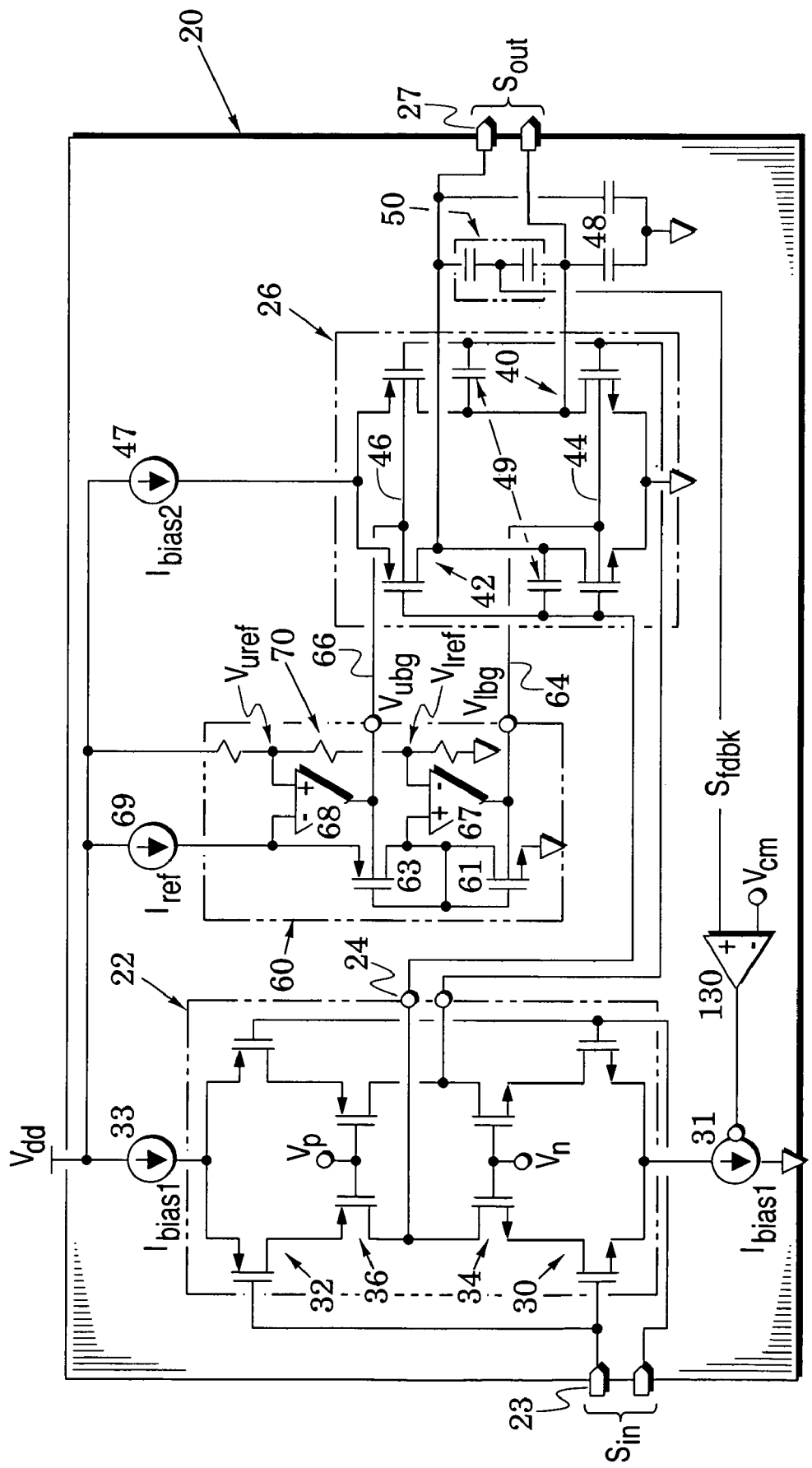
FIG. 1 is a schematic of a transistor amplifier embodiment of the present invention.

FIG. 1 illustrates a differential amplifier embodiment 20 that is configured to realize high signal gains and to also provide high transient currents to drive various loads (e.g., capacitive loads). In addition, the configuration of the embodiment 20 is well suited for electronic systems in which the available amplifier headroom is significantly limited.

In particular, the differential amplifier embodiment 20 of FIG. 1 includes a transistor input stage 22 that is coupled to an input port 23 and configured to provide, in response to a differential input signal $S_{in}$ at that port, an intermediate signal at a differential intermediate port 24 of the amplifier 20. The amplifier also includes a transistor output stage 26 that is coupled to a differential output port 27 and configured to provide, in response to the intermediate signal at the port 24, a differential output signal $S_{out}$.

In an amplifier embodiment, the input stage 22 is arranged as a cascoded complementary differential transistor input stage. In particular, the input stage 22 has a lower differential pair 30 of transistors and an upper differential pair 32 of transistors and the pairs 30 and 32 are coupled between current sources 31 and 33 which provide a bias current $I_{bias1}$. This recited structure establishes a complementary arrangement in the input stage.

In addition, a pair 34 of cascode transistors is inserted between the lower differential pair 30 and the intermediate port 24 and a pair 36 of cascode transistors is inserted between the upper differential pair 30 and the intermediate port. This additional structure establishes a cascoded arrangement in the input stage to thereby provide a cascoded complementary differential transistor input stage. Preferably, voltage sources establish appropriate gate bias voltages $V_p$ and $V_n$ in the pairs 34 and 36 of cascode transistors.

In an amplifier embodiment, the output stage 26 is arranged as a complementary differential transistor output stage. In particular, the output stage 26 has a lower differential pair 40 of transistors and an upper differential pair 42 of transistors with the latter pair coupled to a voltage source that is shown as ground in the embodiment of FIG. 1. This recited structure establishes a complementary arrangement in the output stage.

The gates of a first side of the differential structure of the output stage 26 are coupled to a corresponding side of the intermediate port 24 and gates of a second side of the differential structure are coupled to the other side of the intermediate port. In addition, the drains of the first side of the differential structure are coupled to one side of the output port 27 and the drains of the second side of the differential structure are coupled to the other side of the output port. The lower differential pair 40 of transistors provides a lower pair 44 of transistor back gates and the upper differential pair 42 provides an upper pair 46 of transistor back gates. Finally, a current source 47 is arranged to provide a bias current $I_{bias2}$ to the output stage 26.

In various amplifier embodiments, capacitive structures can be added to enhance various operational parameters. For example, filter capacitors 48 can be coupled to the output port 27 to reduce noise contributions of the output stage 26. In addition, each of Miller compensation capacitors 49 can be coupled between a respective side of the output port 27 and a corresponding side of the intermediate port 24. The value of these compensation capacitors can be varied to shape the frequency response of the gain of the amplifier 20 and thereby enhance the amplifier's stability.

In addition, a pair 50 of common-mode capacitors can be coupled across the output port 27 to provide a common-mode feedback signal $S_{fdbk}$ that is directed back to the input stage 22. An exemplary application of this feedback signal $S_{fdbk}$ will be explored at a later point in this description.

The amplifier 20 also includes a bias controller 60 which has stacked lower and upper diode-coupled transistors 61 and 63 which respectively provide lower and upper back gates 64 and 66 that are respectively coupled to the lower and upper pairs 44 and 46 of back gates of the output stage 26. The bias controller 60 also has lower and upper control amplifiers 67 and 68 that have first input terminals coupled across the upper diode-coupled transistor 63 (i.e., coupled to the lower and upper sides of the transistor 63).

In addition, second input terminals of the lower and upper control amplifiers 67 and 68 are respectively coupled to receive lower and upper reference voltages $V_{lref}$ and $V_{uref}$. Finally, output terminals of the control amplifiers 67 and 68 are respectively coupled to the lower and upper back gates 64 and 66. A current source 69 provides a reference current $I_{ref}$ to the stacked lower and upper diode-coupled transistors 61 and 63. The lower and upper reference voltages $V_{lwr}$ and $V_{upr}$ may be provided by various structures. In the embodiment of FIG. 1, for example, they are provided by respective tap points on a resistor ladder 70 that is arranged between a supply voltage $V_{dd}$ and ground.

In operation of the amplifier 20, the input signal $S_{in}$ is amplified in the input stage 22 to generate an intermediate signal at the intermediate port 24. If the lower differential pair had resistive loads (i.e., if the upper differential pair 32 were replaced with resistors and the current source 33 removed), the transient currents of this stage would be approximately limited to one half of the current of the current source 31. This limitation is removed by the complementary arrangement of the input stage (i.e., combined lower and upper differential pairs 30 and 32) which, in combination with the current sources 31 and 33, provides enhanced transient currents in response to the input signal $S_{in}$.

In addition, the cascoded arrangement of the input stage 22 substantially increases this stage's output impedance so that the enhanced transient currents generate the intermediate signal with substantial gain. Accordingly, the signal gain of the input stage 22 is significantly enhanced. The gain of the input stage is approximately $(g_m R_o)^2$ wherein $g_m$ and $R_o$ are respectively the transconductance and output impedance of the transistors of FIG. 1.

In further operation of the amplifier 20, the output stage 26 generates the output signal $S_{out}$ at the output port 27 in response to the intermediate signal at the intermediate port 24. The structure and arrangement of the output stage provides substantially-enhanced transient currents to the output port 27. This enhancement is provided by the complementary nature of the output stage and its arrangement between ground and the current source 47. The current $I_{bias2}$ of the current source 47 can be advantageously set and ground is a voltage source that can provide virtually unlimited transient currents.

Similar to operation of the input stage discussed above, the transient currents across the output port are not limited to some portion (e.g., one half) of a quiescent current. Instead, the ground source and the current source 47 can provide transient currents well beyond the quiescent current that may be flowing through the output stage in the absence of an intermediate signal at the intermediate port 24. These high transient currents can generate large signal swings across loads coupled to the output port 27.

Thus, the arrangement of the input transistor stage 22 of FIG. 1 is particularly suited for providing a high signal gain and the arrangement of the output transistor stage 26 is particularly suited for providing a high output signal swing across current-demanding load impedances (e.g., capacitive loads).

Before describing operation of the bias controller 60, it is initially noted that the selected size (i.e., gate length and width) of the transistors of the output stage 26 and the amplitude of the bias current $I_{bias2}$ establishes a quiescent output-stage current density in these transistors. It is also recognized that decreasing the back gate bias on the differential pair 40 will cause a decline of the drain voltages if the drain current is fixed as it is by the current source 47.

It is therefore recognized that the quiescent voltage at the drains of the lower differential pair (i.e., at the output port 27) can be controlled by altering the bias voltage on the pair 44 of back gates of the pair 40. Similarly, the quiescent voltage across the upper differential pair (i.e., at the output port 27) can be controlled by altering the bias voltage on the pair 46 of back gates of the pair 42.

In operation of the bias controller 60, the resistor ladder 70 is configured to provide a lower reference voltage $V_{lref}$ to an input terminal of the differential amplifier 67 and to provide an upper reference voltage $V_{uref}$ to an input terminal of the differential amplifier 68. In response, the lower differential amplifier 67 drives the lower back gate 64 of the diode-coupled transistor 61 to a lower back gate voltage $V_{lbg}$ at which the voltage at the drains of diode-coupled transistors 61 and 63 substantially matches the lower reference voltage $V_{lref}$. Similarly, the upper differential amplifier 68 drives the upper back gate 66 of the diode-coupled transistor 68 to an upper back gate voltage $V_{ubg}$ at which the voltage across the diode-coupled transistors 61 and 63 substantially matches the upper reference voltage $V_{uref}$.

In another important feature of the invention, the selected size of the diode-coupled transistors 61 and 63 and the amplitude of the reference current $I_{ref}$ establishes a controller current density in these transistors that substantially matches the output-stage current density in the transistors of the output stage 26. Because of these matches of current density and because the voltages $V_{lbg}$ and $V_{ubg}$ are also respectively coupled to the pairs 44 and 46 of back gates, lower and upper bias voltages are established about the upper differential pair 42 of the output stage 26 that substantially match the lower and upper reference voltages $V_{lref}$ and $V_{uref}$. Thus, these voltages can be independently set and the bias controller 60 drives the pairs 44 and 46 of back gates to establish desired lower and upper bias voltages about the upper differential pair 42.

From inspection of FIG. 1, it is noted that $$V_{top} = V_{GS40} + V_{GS42} \tag{1}$$

wherein $V_{GS40}$ and $V_{GS42}$ are gate-to-source voltages in the lower and upper differential pairs 40 and 42. If $V_{top}$ is the quiescent voltage at the top of the output stage 26 and if saturation voltage $V_{dsat}$ is the least voltage that insures that the transistors of the output stage 26 are biased in their saturation region, then the peak-to-peak output swing at the output port 27 is $$V_{p\text{-}p} = V_{top} - 2V_{dsat} \tag{2}$$

wherein it has been assumed that the transistors of the lower and upper differential pairs 40 and 42 have the same saturation voltage (this assumption is for simplicity of illustration as the saturation voltage of the transistors of the upper differential pair 42 often differs somewhat from the saturation voltage of the transistors of the lower differential pair 40).

In order to have a maximum positive-going transient swing at the output port 26 substantially match a maximum negative-going transient swing, the lower bias voltage should be selected to be substantially one half of the upper bias voltage. For example, if the upper bias voltage at the sources of the upper differential pair 42 is selected to be 1.5 volts, the lower bias voltage at the drains of the upper differential pair 42 (i.e., at the output port 27) is preferably selected to be 0.75 volts. In this example, $V_{GS40}$ and $V_{GS42}$ will be equal and the peak-to-peak signal swing $V_{pp}$ at the output port will be $$V_{p\text{-}p} = 1.5 - 2V_{dsat} \qquad (3)$$

Thus, the bias controller 60 of FIG. 1 arranges stacked diode-coupled transistors 61 and 63, a resistor ladder 70, and differential amplifiers 67 and 68 to accurately bias the lower and upper differential pairs 40 and 42 of the output stage 26 to thereby enhance the signal swing of the output signal $S_{out}$ at the output port 27. As mentioned above, the current sources 47 and 69, the diode-coupled transistors 61 and 63 and the transistors of the output stage 26 are configured so that the all of the transistors carry substantially the same current density. Given that this relationship is maintained, the current of the current source 69 can then be significantly reduced to reduce total amplifier current and enhance the amplifier's efficiency.

In another important feature of the invention, the bias controller 60 is configured to maximize the available headroom (between ground and Vdd) because it biases the output stage 26 without inserting devices that are stacked in series with the lower and upper differential pairs 40 and 42. Instead, it realizes appropriate lower and upper back gate voltages $V_{lbg}$ and $V_{ubg}$ which bias the output stage 26 so as to enhance its peak-to-peak output swing at the output port 27.

It is also noted that, because the lower differential pair 40 is coupled to the voltage source of ground, it can realize transient currents on the order of $$i_{transient} = 2\pi f_{3db} c_{load} V_{peak} \qquad (4)$$

wherein $f_{3db}$ is the 3 db bandwidth of the amplifier and $c_{load}$ is the load capacitance. The transient current in the upper differential pair 42 is limited to substantially one half of the bias current $I_{bias2}$ of the current source 47.

Figure 2A:
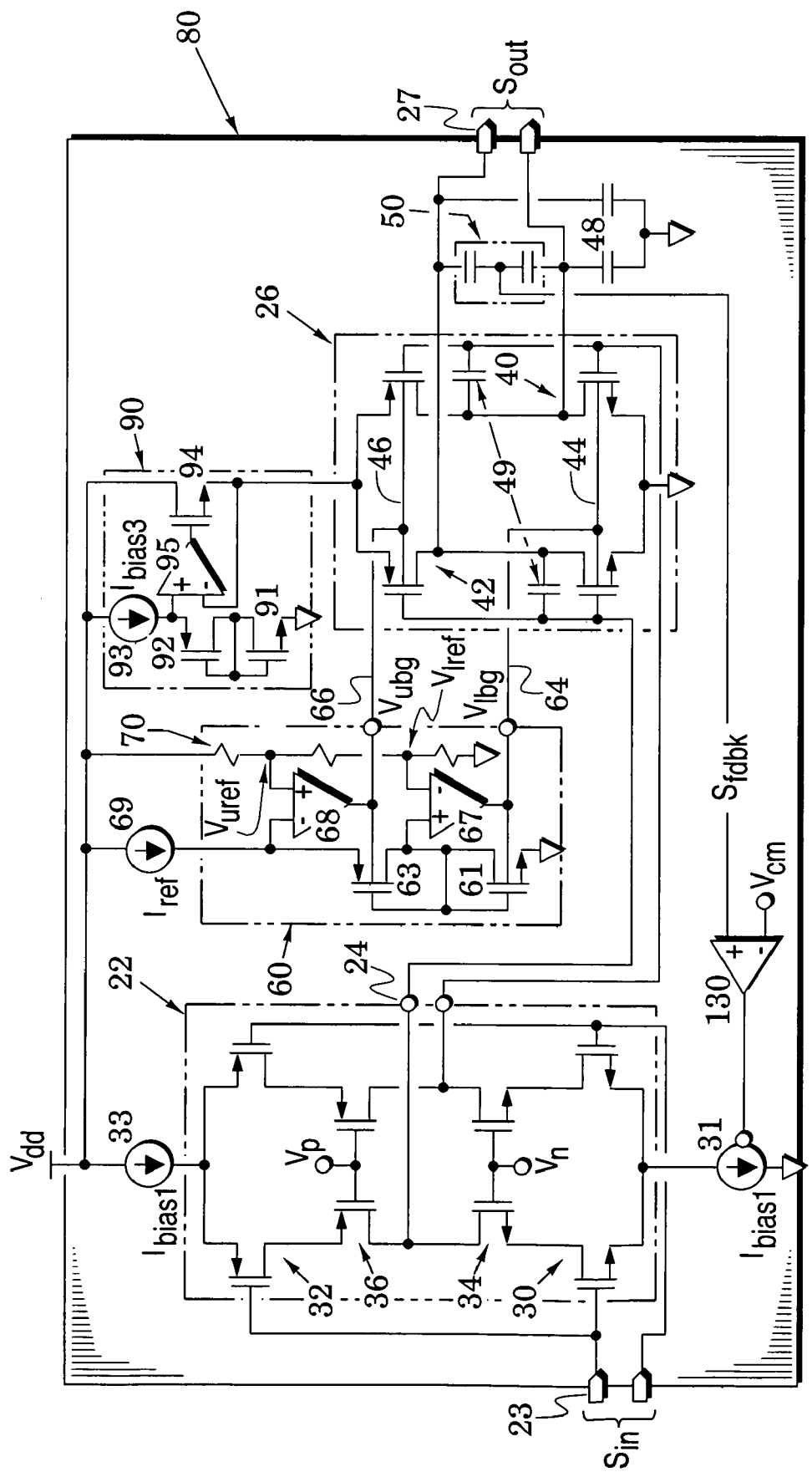
FIGS. 2A and 2B are schematics of other amplifier embodiments.

Finally, it is noted that other embodiments of the differential amplifier 20 may swap selected bias structures of the amplifier. In these embodiments, the upper ports of the bias controller 60 and the output stage 26 are referenced to ground and the current sources 69 and 47 replace ground at the lower ports. These embodiments also provide high transient currents to drive various loads FIG. 2A illustrates another differential amplifier embodiment 80 which shares elements with the amplifier 20 of FIG. 1 with like elements indicated by like reference numbers. In contrast, however, the amplifier 80 replaces the current source 47 of FIG. 1 with a voltage source 90 that includes stacked first and second diode-coupled transistors 91 and 92, a current source 93 that provides a bias current $I_{bias3}$, a source transistor 94 and a differential amplifier 95. The voltage source 90 permits the upper differential pair 42 to realize transient currents on the order of those realized by the lower differential pair 40.

In particular, the current source 93 and an input terminal of the differential amplifier 95 are coupled to an upper current terminal of the stacked first and second diode-coupled transistors. A gate of the source transistor 94 is coupled to the output terminal of the differential amplifier and a source of the source transistor is coupled to the top of the output stage 26 and to the other input terminal of the differential amplifier.

The selected size of the diode-coupled transistors 91 and 92 and the amplitude of the bias current $I_{bias3}$ establishes a current density that substantially matches the output-stage current density in the transistors of the output stage 26. Because of these matches of current density, the voltage across the diode-coupled transistors 91 and 92 substantially matches the voltage across the output stage 26. The differential amplifier 95 then commands the source transistor to supply a current to the output stage that maintains this voltage across the output stage.

Because it is configured as a voltage source, the source 90 is capable of supplying transient currents to the output stage 26 that exceed those of the current source 47 of FIG. 1. The combination of ground and the voltage source 90 provides voltage-source biasing to the output stage 26 can provide large transient currents to this stage which facilitates large peak-to-peak signal swings at the output port 27 even when driving capacitive loads.

Figure 2B:
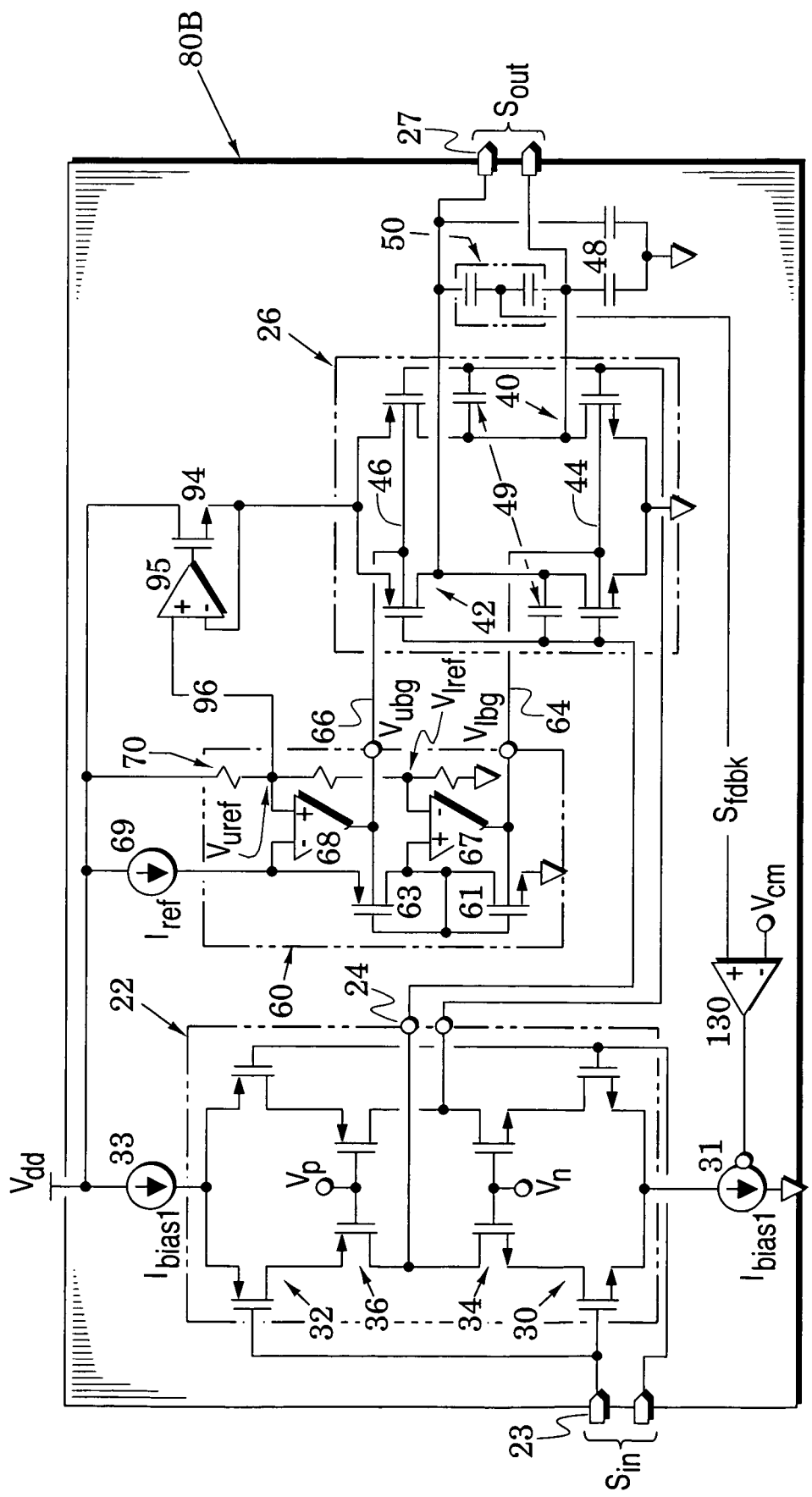

FIG. 2B illustrates another differential amplifier embodiment 80B which shares elements with the amplifier 80 of FIG. 2A with like elements indicated by like reference numbers. In contrast, however, the amplifier 80B discards the stacked diode-coupled transistors 91 and 92 and the current source 93 of the amplifier 2A. In their place, the amplifier 80B provides a connecting path 96 to thereby reference the differential amplifier 95 to the upper reference voltage $V_{uref}$ (that is provided, for example, by the ladder structure 70). In different amplifier embodiment, the connecting path 96 can be arranged to reference the differential amplifier 95 to the upper current terminal of the upper diode-coupled transistor 63.

In operation, the amplifier 95 adjusts the control voltage on the source transistor 94 to maintain the voltage at the upper current terminals of the output stage 26 substantially equal to the upper reference voltage $V_{uref}$. Although this biasing structure of the amplifier 80B is simpler, that of the amplifier 80 provides greater isolation of the bias controller 60.

The amplifier structures exemplified in FIGS. 1, 2A and 2B can be used in a variety of electronic systems. An exemplary system is presented as the pipelined analog-to-digital converter 100 of FIG. 3. The converter 100 includes a pipelined arrangement of converter stages 102 that process samples of an analog input signal (at an input port 103) which are provided by a clocked signal sampler 104. During an initial clock cycle, an initial converter stage is configured (e.g., as a flash converter) to quantize an input sample to an initial number of digital bits.

The initial converter stage (shown as stage 1) then passes the initial bits to a time aligner/corrector 106 and also forms a residue signal $S_{res}$ which is passed to a succeeding converter stage. During a succeeding clock cycle, the succeeding converter stage quantizes this residue signal to provide additional digital bits. It also forms and passes on a corresponding residue signal.

This process continues to a final converter stage which provides final digital bits. Because the converter stages provide their respective bits on successive clock cycles, an aligner/corrector 106 is configured to selectively delay different ones of the bits so as to bring them into time alignment to generate a digital code that corresponds to the initial analog input signal. The converter stages are often configured to provide conversion redundancy (e.g., in the form of redundant digital bits) which is utilized in the aligner/corrector 106 to reduce conversion errors.

Because each converter stage only has to provide limited quantization, the clock speed and corresponding signal throughput of pipelined ADCs can be quite high. In order to enhance accuracy, it has been found useful to provide redundant digital bits which facilitate the correction of conversion errors.

As shown by extension lines 108, an exemplary $i_{th}$ converter stage may include a flash converter 109 and a multiplying digital-to-analog converter (MDAC) 110 which has a DAC 112, a summer 114 and an amplifier 115. The converter 109 provides the respective digital bits $D_i$ of the $i_{th}$ converter stage and the DAC 112 converts this quantization to a corresponding analog signal which is subtracted from an input residue signal in the summer 114 to form a difference signal.

This difference signal is gained up in the amplifier 115 so that the signal window provided to the succeeding converter stage is substantially that presented to the present $i_{th}$ stage. This gained up signal is the output residue signal $s_{res}$ that is passed to the succeeding stage for further conversion. A sample/hold circuit 116 is preferably provided to hold the input residue signal while the MDAC processes it into the succeeding residue signal $S_{res}$.

Figure 3:
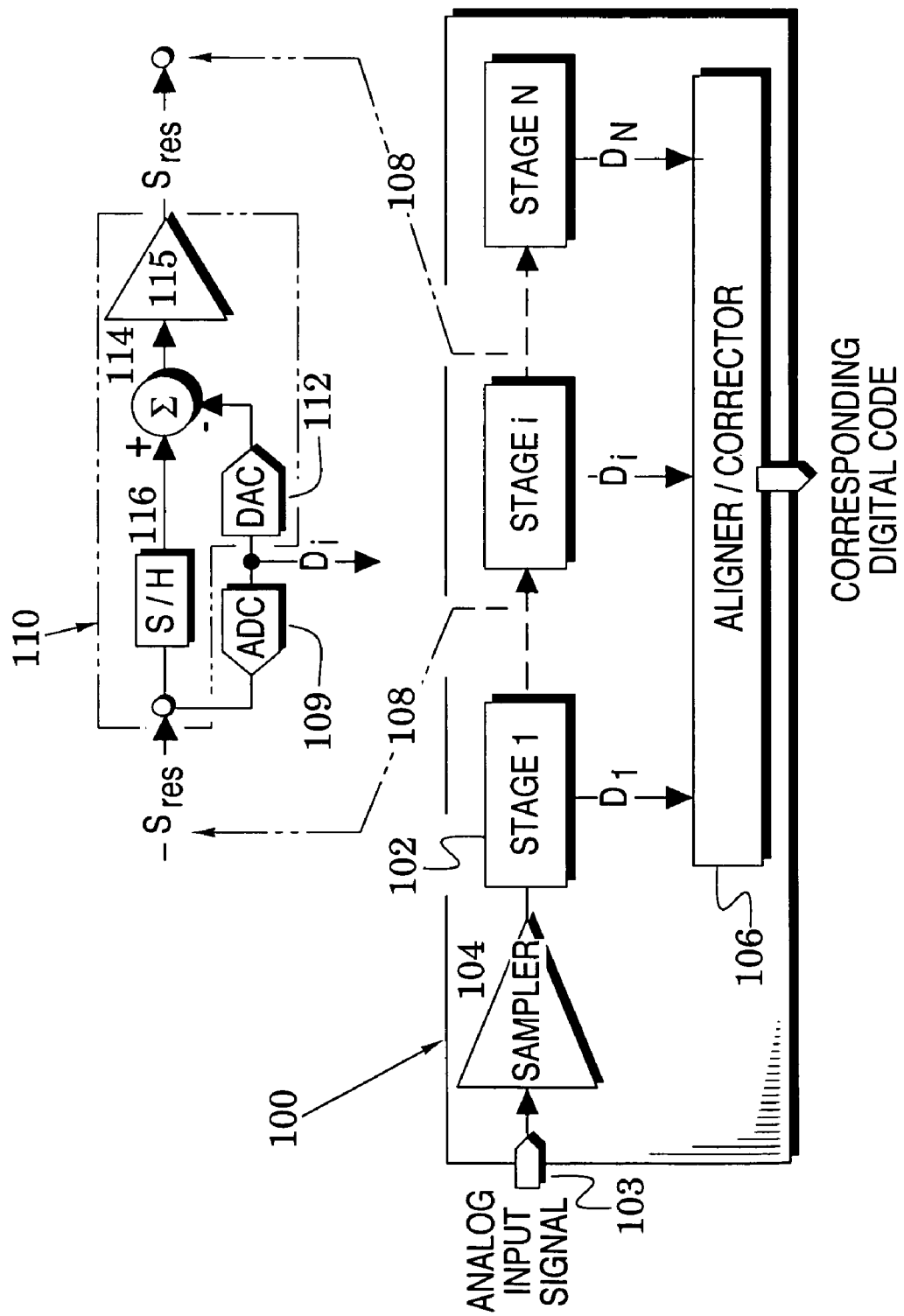
FIG. 3 is a diagram of an analog-to-digital converter system which includes an MDAC embodiment.
Figure 4A:
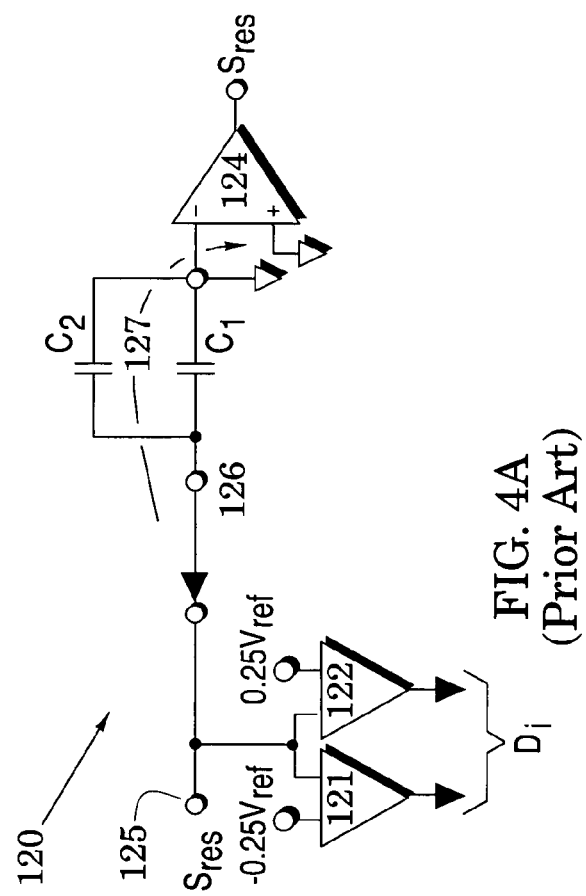
FIGS. 4A and 4B are schematics of an MDAC embodiment which includes an amplifier that may be realized with amplifier embodiments of the present invention.
Figure 4B:
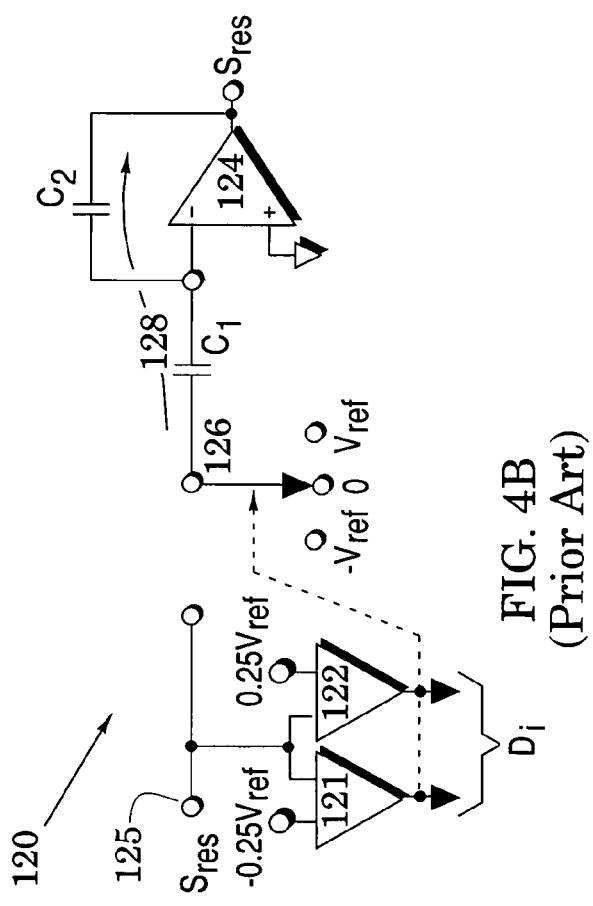

FIGS. 4A and 4B illustrate operational modes of a switched-capacitor structure 120 which may be used to form the MDAC 110 of FIG. 3. For exemplary purposes, the MDAC 120 is shown in a form suitable for use when its respective converter stage 102 of FIG. 3 is a 1.5 bit converter stage. A 1.5 bit stage is an example of a stage that provides redundant bits which, as described above, may be used to improve conversion accuracy in the aligner/corrector (106 in FIG. 3).

The MDAC 120 includes comparators 121 and 122 which form the ADC 109 of FIG. 3. An embodiment of the MDAC 110 of FIG. 3 is provided by an amplifier 124 and associated switched capacitors C1 and C2. The comparators 101 and 102 have decision points set at $-0.25 V_{ref}$ and $+0.25 V_{ref}$ wherein reference voltages $-V_{ref}$ and $+V_{ref}$ define the edges of the analog input window of the respective converter stage.

FIG. 4A shows a sample mode of operation that occurs in a first portion of each clock cycle. During this sample mode, the comparators 121 and 122 compare the input residue signal $S_{res}$ to the references and provide the digital bits $D_i$ of this $i_{th}$ converter stage. In this sample mode, a switch 126 is in a position which couples capacitors C1 and C2 to the input port 125 so that a charging current 127 can charge them to the residue signal $S_{res}$.

FIG. 4B shows a transfer (or gain) mode of operation that occurs during a final portion of the clock cycle that began in FIG. 4A. The switch 126 is now in a position to select an appropriate one of reference signals $-V_{ref}$, 0, and $+V_{ref}$. The appropriate one is a function of the current digital bits $D_i$ as indicated by the broken line 130 which positions the switch 126. Other switches (not shown) of the switched-capacitor structure swing the capacitor C2 about the amplifier 124 so that a transfer current 128 transfers stored charge from capacitor C1 to capacitor C2. The transferred charge alters the amplifier's output to an output residue signal $S_{res}$ that is appropriate for further conversion processing by succeeding ones of the converter stages of FIG. 3.

Any errors that are made in generation of the value of the residue signal $S_{res}$, contribute directly to error in the corresponding digital code that is provided by the aligner/corrector 106 of FIG. 3. Although other portions of the converter structure (e.g., the redundancy of the 1.5 bit converter of FIGS. 4A and 4B) can be used to correct conversion errors and enhance converter accuracy, nothing can be done to correct for errors in the output residue signal $S_{res}$—these errors contribute directly to error in the corresponding digital code.

It is therefore important to enhance the accuracy of the output residue signal $S_{res}$, the amplifier 124 must have a high transient gain so that the input differential signal at its differential input is essentially zero and supply high transient currents so that the transfer current 128 transfers substantially all of the charge from capacitor C1 to capacitor C2. As noted above, the output stage 26 (and associated controller 60 and voltage source 90) of the amplifiers 20 and 80 of FIGS. 1 and 2 is particularly suited for these tasks.

In the description of the amplifiers of FIGS. 1 and 2, the terms gate, back gate, source and drain have been used to refer to transistor terminals. This is for convenience of exemplary illustration and description as amplifier embodiments of the invention may be realized with various transistor structures that have first and second current terminals responsive to corresponding control terminals.

Although it may often be realized in a differential arrangement, the MDAC structure 120 of FIGS. 4A and 4B is shown in a single-ended arrangement for simplicity of illustration and description. When the amplifiers of FIGS. 1 and 2 are used in differential MDAC structure, it is generally desired to maintain a desired common-mode level at the output port 27.

Accordingly, the voltage at the pair 50 of common-mode capacitors can be fed back as a feedback signal $S_{fdbk}$ to a differential amplifier 130 where it is compared to a common-mode voltage $V_{cm}$. The difference is applied to a port of the current source 31 so that the current of this source is altered to thereby shift operating points in the input and output amplifier stages 24 and 26. The feedback action drives the common-mode level at the output port 27 to substantially match the common-mode voltage $V_{cm}$.

The embodiments of the invention described herein are exemplary and numerous modifications, variations and rearrangements may achieve substantially equivalent results and are intended to be embraced in the appended claims.

We claim:

1. An amplifier for processing a differential input signal into a differential output signal, comprising:
    a cascoded complementary differential input stage coupled to generate an intermediate signal in response to said input signal: and
    a complementary differential output stage arranged between lower and upper ports with one of said lower and upper ports coupled to ground wherein said output stage is coupled to provide said output signal in response to said intermediate signal;
    wherein said output stage includes lower and upper differential pairs of transistors which respectively have lower and upper coupled back gates and further including a bias controller that is configured to provide bias voltages for said lower and upper coupled back gates.

2. The amplifier of claim 1 wherein said bias controller is configured so that said lower and upper differential pairs of transistors and said lower and upper diode-coupled transistors carry substantially the same current density.

3. The amplifier of claim 1, wherein said bias controller includes:
    stacked lower and upper diode-coupled transistors respectively having lower and upper back gates respectively coupled to said lower and upper coupled back gates; and
    lower and upper differential amplifiers with first input terminals coupled across one of said lower and upper diode-coupled transistors and second input terminals respectively coupled to receive lower and upper reference voltages and with output terminals respectively coupled to said lower and upper back gates.

4. The amplifier of claim 3, further including a resistor ladder that establishes said lower and upper reference voltages.

5. The amplifier of claim 3, further including a voltage source coupled to bias the other of said lower and upper ports.

6. The amplifier of claim 5, wherein said voltage source includes:
   a source transistor having a current terminal coupled to one of said lower and upper differential ports and having a control terminal; and
   a differential amplifier with a first input terminal coupled to an input terminal of one of said lower and upper differential amplifiers, a second input terminal coupled to said current terminal and an output terminal coupled to said control terminal.

7. The amplifier of claim 5, wherein said voltage source includes:
   stacked first and second diode-coupled transistors having lower and upper current terminals;
   a source transistor having a current terminal coupled to one of said lower and upper differential ports and having a control terminal; and
   a differential amplifier with a first input terminal coupled to one of said lower and upper current terminals, a second input terminal coupled to said current terminal and an output terminal coupled to said control terminal.

8. The amplifier of claim 1, wherein said output stage has a differential input port and a differential output port and further including compensation capacitors coupled from said output port to said input port.

9. The amplifier of claim 8, further including:
   an adjustable current source coupled to said input stage;
   a capacitor divider coupled across said output port to provide a common-mode component of said output signal; and
   a differential amplifier coupled to adjust said current source in response to the difference between said common-mode component and a common-mode reference signal.

10. The amplifier of claim 1, further including a current source coupled to drive the other of said lower and upper ports.

11. An amplifier for processing a differential input signal into a differential output signal, comprising:
   a cascoded complementary differential input stage coupled to generate an intermediate signal in response to said input signal; and
   a complementary differential output stage coupled to provide said output signal in response to said intermediate signal wherein said output stage includes lower and upper differential pairs of transistors which respectively have lower and upper coupled back gates; and
   a bias controller that is configured to provide bias voltages for said lower and upper coupled back gates.

12. The amplifier of claim 11, wherein said bias controller includes:
   stacked lower and upper diode-coupled transistors respectively having lower and upper back gates respectively coupled to said lower and upper coupled back gates; and
   lower and upper differential amplifiers arranged to respectively drive said lower and upper back gates to substantially match voltages across said lower and upper diode-coupled transistors to lower and upper reference voltages.

13. The amplifier of claim 12, wherein said lower and upper differential amplifiers are arranged with first input terminals coupled across one of said lower and upper diode-coupled transistors, second input terminals respectively coupled to receive lower and upper reference voltages, and output terminals respectively coupled to said lower and upper back gates.

14. The amplifier of claim 12, further including a resistor ladder that establishes said lower and upper reference voltages.

15. The amplifier of claim 12, wherein said output stage is arranged between lower and upper ports and one of said lower and upper ports is coupled to ground and further including a voltage source coupled to bias the other of said lower and upper ports.

16. The amplifier of claim 15 wherein said voltage source includes:
   a source transistor having a current terminal coupled to one of said lower and upper differential ports and having a control terminal; and
   a differential amplifier with a first input terminal coupled to an input terminal of one of said lower and upper differential amplifiers, a second input terminal coupled to said current terminal and an output terminal coupled to said control terminal.

17. The amplifier of claim 12, further including:
   stacked first and second diode-coupled transistors having lower and upper current terminals;
   a source transistor having a current terminal coupled to one of said lower and upper differential ports and having a control terminal; and
   a differential amplifier with a first input terminal coupled to one of said lower and upper current terminals, a second input terminal coupled to said current terminal and an output terminal coupled to said control terminal.

18. A signal converter system that converts analog input signals to corresponding digital signals, comprising:
   a sampler that provides samples of said input signal;
   successive converter stages that, for each sample of said samples, provide successive digital estimates of said sample and generate a corresponding residue signal;
   a multiplying digital-to-analog converter in each of said converters that is configured to generate said residue signal with aid of a residue amplifier; and
   an aligner/corrector that provides said corresponding digital signals in response to said successive digital estimates;
   wherein said residue amplifier processes a differential input signal into a differential output signal and includes:
      a cascoded complementary differential input stage coupled to generate an intermediate signal in response to said input signal; and
      a complementary differential output stage arranged between lower and upper ports with one of said lower and upper ports coupled to ground wherein said output stage is coupled to provide said output signal in response to said intermediate signal;
      and wherein said output stage includes lower and upper differential pairs of transistors which respectively have lower and upper coupled back gates and further including a bias controller that is configured to provide bias voltages for said lower and upper coupled back gates.

19. The system of claim 18, wherein said bias controller includes:
   stacked lower and upper diode-coupled transistors respectively having lower and upper back gates respectively coupled to said lower and upper coupled back gates; and lower and upper differential amplifiers arranged to respectively drive said lower and upper back gates to substantially match voltages across said lower and upper diode-coupled transistors to lower and upper reference voltages.

20. The amplifier of claim 18, further including a voltage source coupled to bias the other of said lower and upper ports wherein said voltage source includes:
   a source transistor having a current terminal coupled to one of said lower and upper differential ports and having a control terminal; and
   a differential amplifier with a first input terminal coupled to an input terminal of one of said lower and upper differential amplifiers, a second input terminal coupled to said current terminal and an output terminal coupled to said control terminal.

21. An amplifier to amplify an input signal into an output signal with controlled bias, comprising:
   a transistor arranged to process said input signal into said output signal and having a transistor backgate;
   a diode-coupled transistor having a control backgate coupled to said transistor backgate; and
   a differential amplifier arranged to drive said control backgate to substantially match voltage across said diode-coupled transistor to a reference voltage.

22. The amplifier of claim 21, wherein said differential amplifier is arranged with a first input terminal coupled to said diode-coupled transistor, a second input terminal coupled to receive said reference voltage, and an output terminal coupled to said control backgate.

23. The amplifier of claim 21, further including a second transistor source-coupled to said transistor and having a second transistor backgate coupled to said transistor backgate.

24. The amplifier of claim 21, further including:
   a second transistor gate-coupled and drain-coupled to said transistor and having a second transistor backgate;
   a second diode-coupled transistor stacked with said diode-coupled transistor and having a second control backgate coupled to said second transistor backgate; and
   a second differential amplifier arranged to drive said second control backgate to substantially match voltage across said second diode-coupled transistor to a second reference voltage.

25. The amplifier of claim 24, wherein said second transistor has a second source terminal and further including:
   a source transistor having a current terminal coupled to said second source terminal and having a control terminal; and
   a source differential amplifier with a first input terminal coupled to an input terminal of one of said differential amplifier and said second differential amplifier, a second input terminal coupled to said current terminal and an output terminal coupled to said control terminal.

26. The amplifier of claim 24, wherein said second transistor has a second source terminal and further including:
   stacked third and fourth diode-coupled transistors having lower and upper current terminals;
   a source transistor having a current terminal coupled to said second source terminal and having a control terminal; and
   a differential amplifier with a first input terminal coupled to one of said lower and upper current terminals, a second input terminal coupled to said current terminal and an output terminal coupled to said control terminal.

* * * * *